(12) United States Patent
Nakagawa et al.

(10) Patent No.: US 9,505,084 B2
(45) Date of Patent: Nov. 29, 2016

(54) JOINING METHOD AND JOINING COMPONENT

(75) Inventors: Shigeyuki Nakagawa, Yokohama (JP); Yoshitaka Uehara, Yokohama (JP); Chika Yamamoto, Yokohama (JP); Kenji Miyamoto, Yokohama (JP); Toshikazu Nanbu, Yokohama (JP)

(73) Assignee: NISSAN MOTOR CO., LTD., Yokohama-Shi (JP)

( * ) Notice: Subject to any disclaimer, the term of this patent is extended or adjusted under 35 U.S.C. 154(b) by 330 days.

(21) Appl. No.: 14/345,031

(22) PCT Filed: Jul. 10, 2012

(86) PCT No.: PCT/JP2012/067542
§ 371 (c)(1),
(2), (4) Date: Mar. 14, 2014

(87) PCT Pub. No.: WO2013/042434
PCT Pub. Date: Mar. 28, 2013

(65) Prior Publication Data
US 2014/0348576 A1    Nov. 27, 2014

(30) Foreign Application Priority Data

Sep. 22, 2011   (JP) ................................. 2011-206714
Mar. 8, 2012   (JP) ................................. 2012-051727

(51) Int. Cl.
*B23K 35/12*    (2006.01)
*B23K 20/233*    (2006.01)
(Continued)

(52) U.S. Cl.
CPC ......... *B23K 20/2333* (2013.01); *B23K 20/026* (2013.01); *B23K 20/16* (2013.01); *B23K 20/2336* (2013.01); *B23K 20/24* (2013.01);
(Continued)

(58) Field of Classification Search
CPC  B23K 20/026; B23K 20/16; B23K 20/2336; B23K 20/2333; B23K 26/037; B23K 26/211; B23K 26/244; Y10T 403/479; Y10T 428/12493
USPC ......... 403/265, 270, 272; 428/615; 219/148, 219/121.35, 121.85, 118; 228/249, 124.7
See application file for complete search history.

(56) References Cited

U.S. PATENT DOCUMENTS 3,100,933 A * 8/1963 Hancock ............ B23K 20/2336
156/306.6
3,121,785 A * 2/1964 Terrill ................ B23K 20/2336
219/118
(Continued)

FOREIGN PATENT DOCUMENTS

JP    55-057388 A    4/1980
JP    55-100882 A    8/1980
(Continued)

*Primary Examiner* — Chi Q Nguyen
(74) *Attorney, Agent, or Firm* — Foley & Lardner LLP

(57) ABSTRACT

In joining members to be joined (1, 1) by heating the members to be joined (1, 1) that are mated with intervening an insert (2) while applying opposing loads to the members to be joined (1, 1), so as to allow eutectic reaction to occur between the members to be joined (1, 1) and the insert (2) to discharge a eutectic melt from a joining plane along with an oxide film (1a) of the members to be joined, the members to be joined (1) are brought into contact with the insert (2) so that the oxide film (1a) is broken by a stress concentrating means previously provided at least one of joining portions breaks to produce a starting point of the eutectic reaction.

15 Claims, 12 Drawing Sheets

(51) Int. Cl.
*B23K 20/02* (2006.01)
*B23K 20/16* (2006.01)
*B23K 20/24* (2006.01)

(52) U.S. Cl.
CPC ............ *B23K26/037* (2015.10); *B23K 26/211* (2015.10); *B23K 26/244* (2015.10); *B23K 2201/18* (2013.01); *B23K 2203/10* (2013.01); *Y10T 403/479* (2015.01); *Y10T 428/12493* (2015.01)

(56) References Cited

U.S. PATENT DOCUMENTS

| | | | | |
|---|---|---|---|---|
| 3,214,564 | A * | 10/1965 | Katzer | B23K 11/00 219/117.1 |
| 3,592,995 | A * | 7/1971 | Hinrichs | H01J 37/18 219/121.13 |
| 4,349,954 | A * | 9/1982 | Banks | B23K 17/00 29/458 |
| 4,689,465 | A * | 8/1987 | Pal | B23K 35/004 219/117.1 |
| 5,348,210 | A * | 9/1994 | Linzell | B23K 20/129 228/115 |
| 6,552,292 | B1 | 4/2003 | Nomura et al. | |
| 8,502,105 | B2 * | 8/2013 | Tanaka | B23K 11/115 219/86.22 |
| 8,726,507 | B2 * | 5/2014 | Bajusz | F28D 1/0308 165/170 |
| 2005/0067383 | A1 | 3/2005 | Ohashi et al. | |
| 2006/0115323 | A1 * | 6/2006 | Coppeta | A61K 9/0097 403/270 |
| 2008/0026247 | A1 * | 1/2008 | Nakagawa | B23K 11/115 428/649 |
| 2008/0241572 | A1 * | 10/2008 | Miyamoto | B23K 11/115 428/600 |
| 2008/0248222 | A1 * | 10/2008 | Ohara | B32B 15/01 428/34.6 |
| 2010/0129684 | A1 | 5/2010 | Nakagawa et al. | |

FOREIGN PATENT DOCUMENTS

| | | |
|---|---|---|
| JP | 57-079087 A | 5/1982 |
| JP | 63-10084 A | 1/1988 |
| JP | 3-066072 A | 3/1991 |
| JP | 2000-263243 A | 9/2000 |
| JP | 2002-066759 A | 3/2002 |
| JP | 2005-103556 A | 4/2005 |
| JP | 2006-175502 A | 7/2006 |
| JP | 2007-105737 A | 4/2007 |
| JP | 2007-105776 A | 4/2007 |
| JP | 2007-130686 A | 5/2007 |
| JP | 2007-152401 A | 6/2007 |
| JP | 2008-000754 A | 1/2008 |
| JP | 2008-023583 | 2/2008 |
| JP | 2008-264822 A | 11/2008 |
| JP | 2009-113050 A | 5/2009 |
| JP | 2009-256701 A | 11/2009 |
| WO | WO 2008/120428 A1 | 10/2008 |

* cited by examiner

JOINING METHOD AND JOINING COMPONENT

TECHNICAL FIELD

The present invention relates to a low-cost joining method that can join materials coated with a stable oxide film such as aluminum-based metal materials in the air and at low temperature, and can minimize a thermal influence on the base material or surroundings, and is also related to a joined component by using the method.

BACKGROUND ART

For example, aluminum-based metal materials have a dense and firm oxide film on the surface. Due to this offending oxide film, it is difficult to join such aluminum-based metal materials by a metallurgical method.

For example, Patent Literature 1 describes a method of joining aluminum to aluminum or aluminum to alumina, including: intervening an insert between faces to be joined wherein the insert includes an element that reacts with the base material to cause eutectic reaction, making them in contact with each other in an oxygen atmosphere, and then heating the faces to be joined to a temperature in the range that effects the eutectic reaction, so as to produce a melt phase on the contact face due to the eutectic reaction as well as an oxide phase due to a reaction between the components of the base material and oxygen present at the gap of the contact face (see claim 1). As a result, it is described that the oxide film on the surface of the base material is broken and mixed in the melt phase along with the oxide produced by a reaction between the components of the melt phase and oxygen (see a middle part of the left column on page 3).

Another joining technique for aluminum-based metals known in the art is brazing by an Al—Si brazing alloy. However, this method requires removing the oxide film by using, for example, a fluoride flux.

CITATION LIST

Patent Literature

Patent Literature 1 JP Hei3-66072A (examined)

SUMMARY OF INVENTION

Technical Problem

However, the above-described method of Patent Literature 1 requires mechanically breaking the oxide film at the contact between the insert and the base material on the joining faces so as to bring the insert into contact with the base material to allow the eutectic reaction to occur, and which requires very large lord (apparent pressure). As a result, there is a problem that this large lord may deform the members to be joined to cause large damage to them.

In particular, if the members to be joined are semiconductors or the like, exposure to such large load impairs their function. Therefore, there has been a problem that the above-described joining method is not applicable to such materials.

Further, since its joining step is carried out in an oxygen atmosphere, the method requires a special chamber, which results in another problem of an increased cost for the equipment.

The present invention was made to cope with the above-described problems with joining of members at least one of which have an oxide film stable at ambient temperatures at the joining face such as aluminum-based metal materials, and it is an object of the present invention to provide a joining method that can join such members in the air and with low applied pressure, and without using any flux as well.

Furthermore, it is another object of the present invention to provide various joined components produced by the joining method.

Solution to Problem

As a result of diligent study for achieving the above objects, the present inventors found that the above-described problems can be solved by providing a stress concentrating means on a portion to be joined in a method of joining members to be joined that includes intervening an insert between the members to be joined and discharging a eutectic melt produced between a base material and the insert along with the oxide film. The present invention was thus completed.

That is, the present invention is based on the above-described idea, and a joining method of the present invention includes: joining members to be joined by heating the members to be joined that are mated with intervening an insert while applying opposing loads to the members to be joined, so as to allow eutectic reaction to occur between the members to be joined and the insert to discharge a resulting eutectic melt from a joining plane along with an oxide film of the members to be joined, wherein a stress concentrating means to break the oxide film is provided at least one of a joining portion.

Further, a joined component of the present invention is joined by the above-described method, wherein the members to be joined are joined at their fresh surfaces.

A joining structure of the present invention includes a direct joining portion between the members to be joined and an indirect joining portion mediated by a mixture containing the oxide film of the members to be joined and a eutectic reaction product, wherein the direct joining portion and the indirect joining portion are randomly located on a joining interface.

Advantageous Effects of Invention

Since the stress concentrating means such as protrusions is provided on at least one of the portions to be joined, the present invention can reduce the load (applied pressure) that is required for breaking the oxide film on the base material to form an starting point of the eutectic reaction, which allows for reducing the damage caused by deformation of the members to be joined.

DESCRIPTION OF EMBODIMENTS

Figure 1:
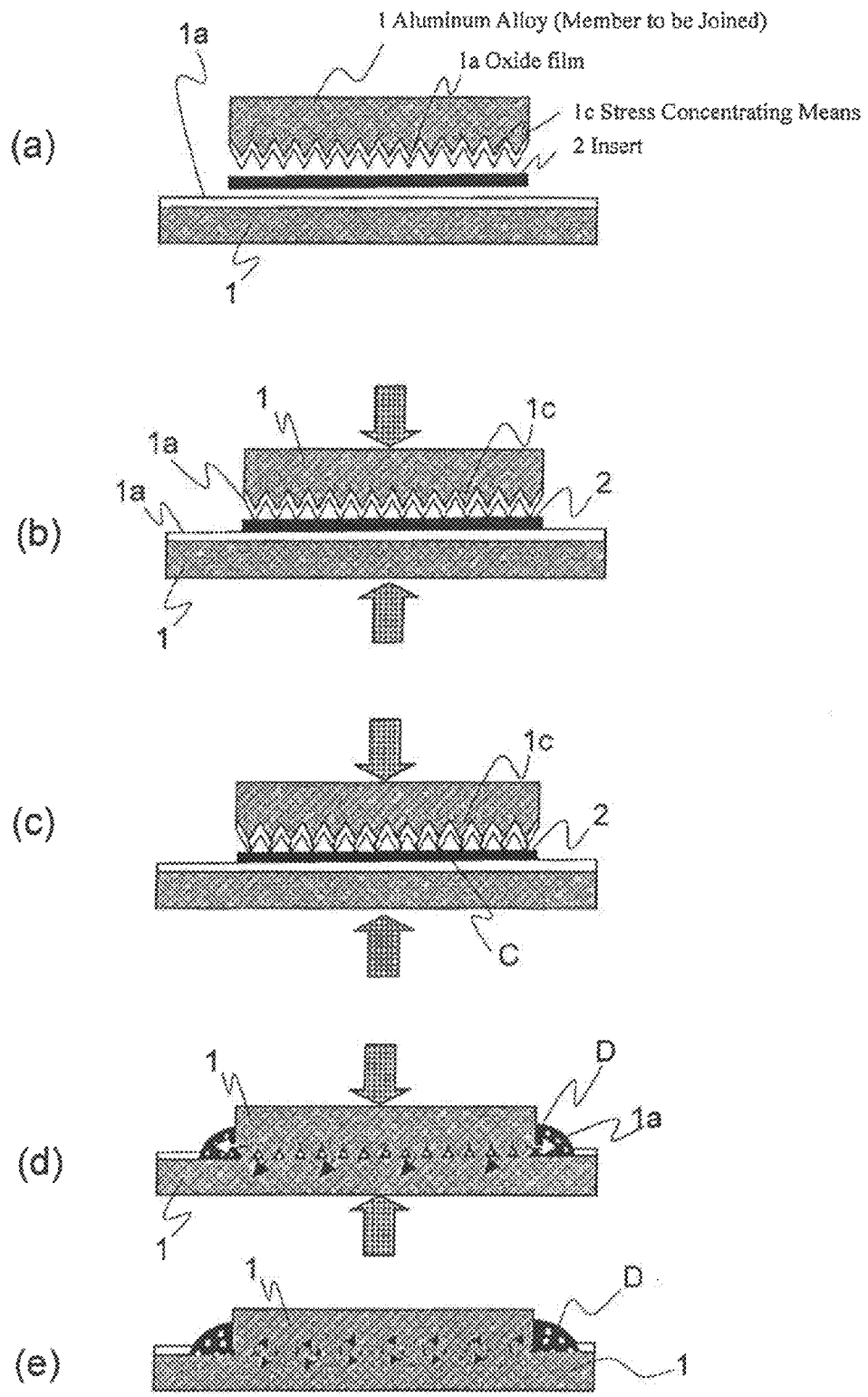
FIGS. 1(a) to 1(e) are a process chart schematically illustrating a joining process according to the joining method of the present invention.

Hereinafter, the joining method of the present invention will be described in more detail and more specifically as well as the structure of the resulting joined component and the like. As used herein, the symbol "%" means mass percent unless otherwise noted.

The joining method of the present invention is operated by allowing eutectic reaction to occur between members to be joined and an insert intervened between them, and then discharging the resulting eutectic melt from the joining plane along with the oxide films on the surfaces of the members to be joined. As a result, even if the joining faces are coated with a firm oxide film, the occurrence or the eutectic reaction enables firm joining between new surfaces.

In the joining method of the present invention, a stress concentrating means such as protrusion (uneven structure) is provided on at least one of the portions to be joined, for example, on either or both of the joining faces or on a face of the insert to be in contact with the members to be joined. With this, the oxide film on the surface of the base material can be broken under low load so as to form a starting point of the eutectic reaction. As a result, the joining method can join semiconductor components or thin members having a thickness of 1 mm or less with low applied pressure, can minimize influence on the members to be joined and the surroundings, and can be operated at low cost.

In the joining method of the present invention, the stress concentrating means (e.g. an uneven structure) is formed on a portion to be joined (e.g. the faces of the members to be joined).

Subsequently, the insert is sandwiched between the joining faces with the stress concentrating means. The insert contains an element that reacts with the members to be joined to cause eutectic reaction.

Then, in the joining step, when opposing loads are applied to respective members to be joined, the stress concentrating means on the joining faces locally increases the stress to locally break the oxide film of the members to be joined. The eutectic reaction occurs when the oxide films on the both sides are locally and mechanically broken so that new surfaces of both members to be joined are exposed and when the temperature reaches a level that effects the eutectic reaction. The reaction produces the eutectic melt of an element of the base material and an element of the insert at the joining interface between the two materials.

The pressure is continuously applied to discharge the oxide films on the surfaces of the base materials along with the resulting eutectic melt, so as to directly join the faces of to be joined the members to each other.

In this step, since the stress concentrating means (uneven structure) is formed on the joining faces, its protrusion tips selectively come in contact with the counterpart face to locally increase the stress. As a result, the oxide film is locally broken under low load to cause the eutectic reaction. This allows for forming firm joining with fresh surfaces under low load.

FIGS. 1(a) to 1(e) are schematic views illustrating a joining process between aluminum-based metal materials according to the joining method of the present invention.

First, as illustrated in FIG. 1(a), aluminum alloy members 1, 1 of aluminum-based metal, which are the members to be joined, are mated with each other with intervening an insert 2 of Zn (zinc)-containing material such as zinc foil, which is the component that reacts with Al to cause the eutectic reaction.

The aluminum alloy members 1, 1 is provided with a stress concentrating means 1c of an uneven structure on the surface, specifically on the joining face of the upper alloy member in the figure in this case. On the surface of the stress concentrating means 1c, an oxide film 1a mainly composed of $Al_2O_3$ is formed.

Next, as illustrated in FIG. 1(b), both alloy members 1, 1 are pressed to make close contact with each other with intervening the insert 2. While applying the load, heating is started. Then, despite the low load, the stress rapidly increases locally at the portions in contact with the protrusion tips of the stress concentrating means 1c to mechanically break the oxide film 1a of the alloy member 1 to cause cracks C.

While the produced fresh surface of the alloy member 1 remains in direct contact with the insert 2 through the cracks C, when the temperature of the joining faces reaches a level that effects the eutectic reaction, the Al component in the alloy member 1 causes the eutectic reaction to produce a eutectic melt phase. Then, as illustrated in FIG. 1(d), the eutectic melt spreads, and flakes of the broken oxide film 1a are dispersed in the eutectic melt phase.

As illustrated in FIG. 1(e), the continuously applied pressure discharges the eutectic melt from the joining interface, in which the flakes of the oxide film 1a dispersed in this liquid phase is also pushed out of the joining interface to form a discharge D along with the eutectic melt. As a result, fresh surfaces of the respective alloy members 1, 1 are joined to each other.

Depending on the joining conditions, a slight amount of mixture derived from the insert, specifically a mixture containing Zn and a Zn—Al alloy in this case, might be locally left at the joining interface.

Figure 2:
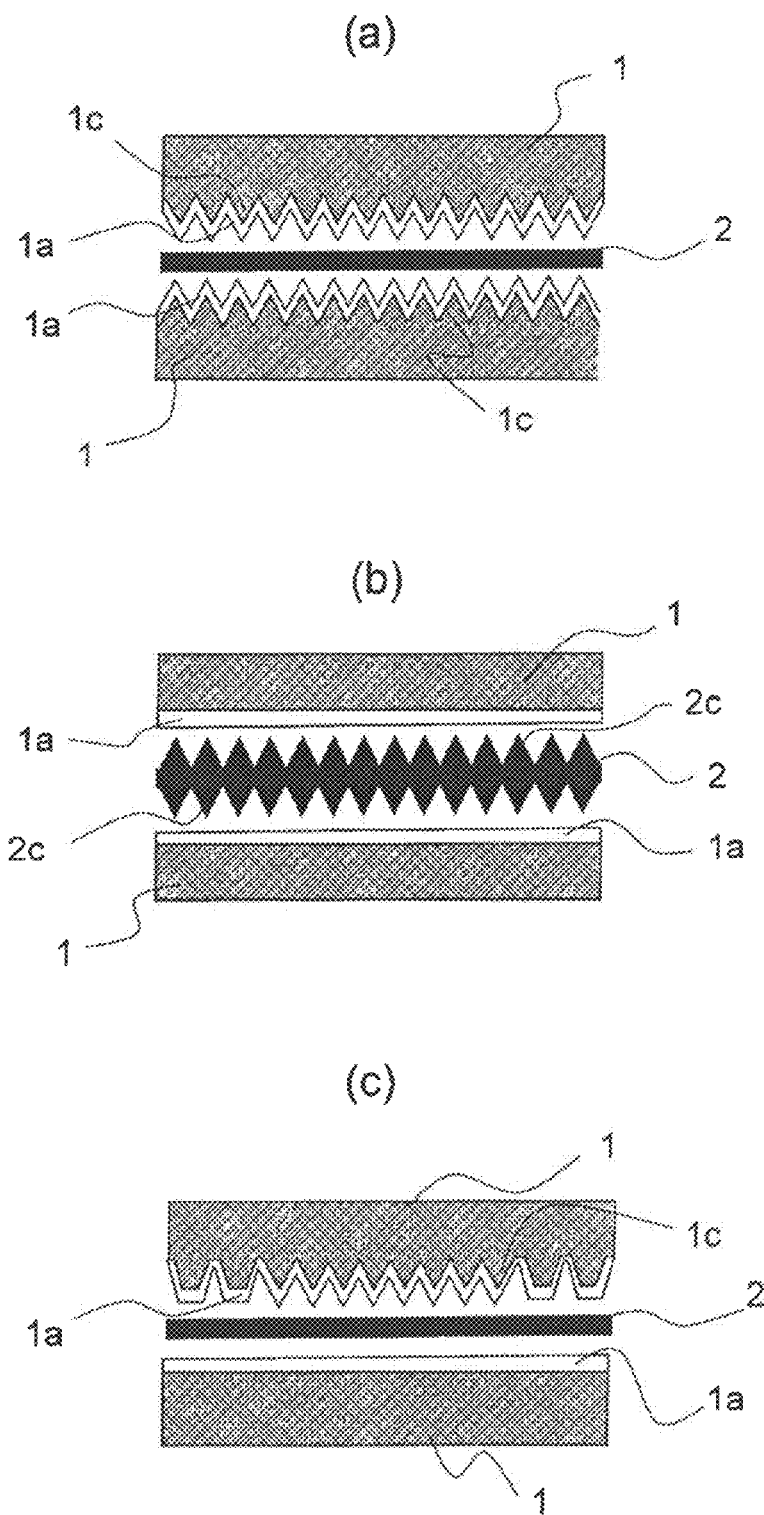
FIGS. 2(a) to 2(c) are views for describing exemplary shapes and positions of the stress concentrating means according to the joining method of the present invention.

Regarding the position of the stress concentrating means 1c, it is formed on at least one of the portions to be joined. Besides one of the joining faces of the alloy members 1, 1, i.e. the members to be joined, as described above, it may be provided on both of the joining faces as illustrated in FIG. 2(a). By forming on both faces, the number of the starting points where the oxide film brakes can be increased.

Alternatively, as illustrated in FIG. 2(b), it may be formed on the insert 2. In this case, the manufacturing process of the members to be joined does not require an additional step of forming the stress concentrating means, which allows for low cost joining.

Figure 3:
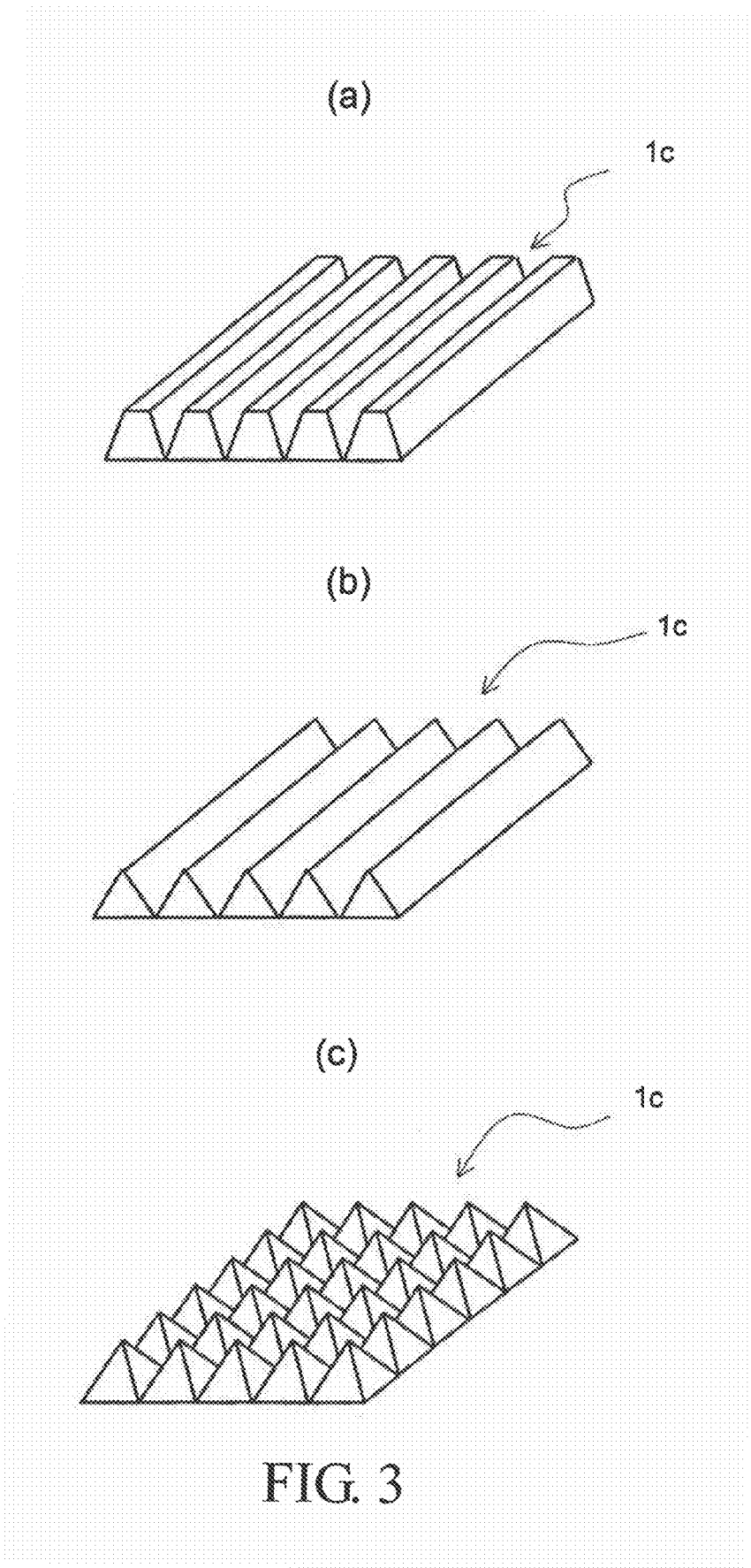
FIGS. 3(a) to 3(c) are views for describing exemplary shapes of the stress concentrating means according to the joining method of the present invention.

Regarding the shape of the stress concentrating means 1c, for example, those illustrated in FIGS. 3(a) to 3(c) may be employed.

Specifically, as illustrated in FIG. 3(a), an uneven structure having a trapezoidal cross-sectional shape may be employed. Due to its approximately flat protrusion tips, the stress concentration decreases in some degree, but the stress concentrating means is readily formed, which allows for reducing the processing cost.

As illustrated in FIG. 3(b), an uneven structure with an array of triangle poles may also be employed. In this case, linear protrusion tips of the uneven structure enhance the stress concentration, which results in improved performance of breaking the oxide film.

This stress concentrating means 1c may be formed on both opposing joining faces, and they may be positioned such that their linear tips intersect with each other. By doing so, the joining faces come in contact with each other at points, and the local stress is further increased. As a result, high joining strength can be obtained even by the joining step under a reduced load. It is desirable that the linear tips of the stress concentrating means 1c intersect at a right angle, but a certain level of the advantageous effect is obtained at an angle of 10° or more.

Further, as illustrated in FIG. 3(c), an uneven structure with quadrangular pyramids arranged in rows and columns may be employed. In this case, pointed protrusion tips of the textured structure further improves the stress concentration, which results in improved performance of breaking the oxide film.

The stress concentrating means 1c may have any shape as long as it serves to concentrate the stress to promote breakage of the oxide film, and its scale (the number of protrusions) and shape are not limited. Besides the above-described shapes, the protrusion tips may have a round shape such as semicircular column, wave and hemisphere. It is understood that the round shape with a smaller curvature radius causes stronger stress concentration, and can break the oxide film more readily.

The uneven structure of the stress concentrating means 1c preferably has an aspect ratio of 0.001 or more and a pitch of 1 μm or more, and more preferably has an aspect ratio of 0.1 or more and a pitch of 10 μm or more. With an aspect ratio of less than 0.001 and a pitch of less than 1 μm, the stress concentration may become insufficient to cause difficulty in breaking the oxide film.

Figure 4:
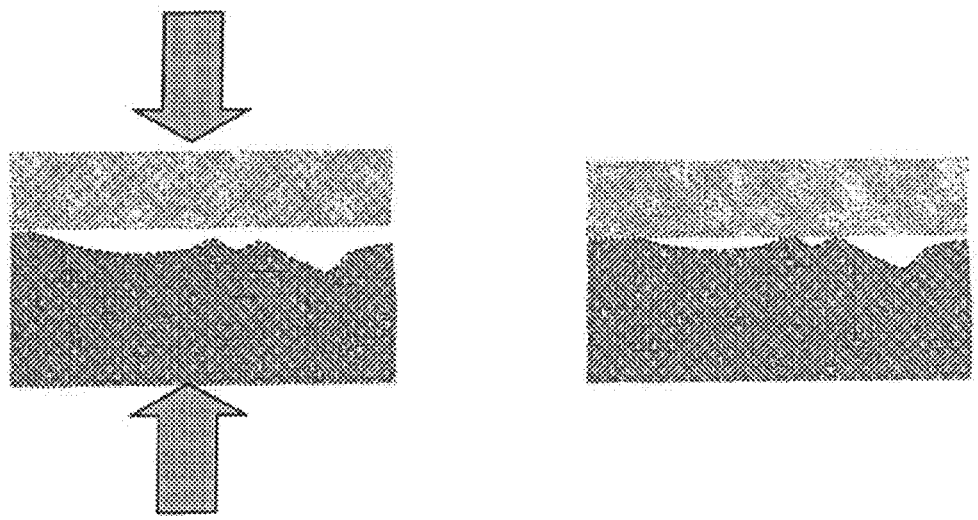
FIGS. 4(a) and 4(b) are explanatory views illustrating an influence of positional variation of the crests of the stress concentrating means on the contact area according to the joining method of the present invention.
Figure 4:
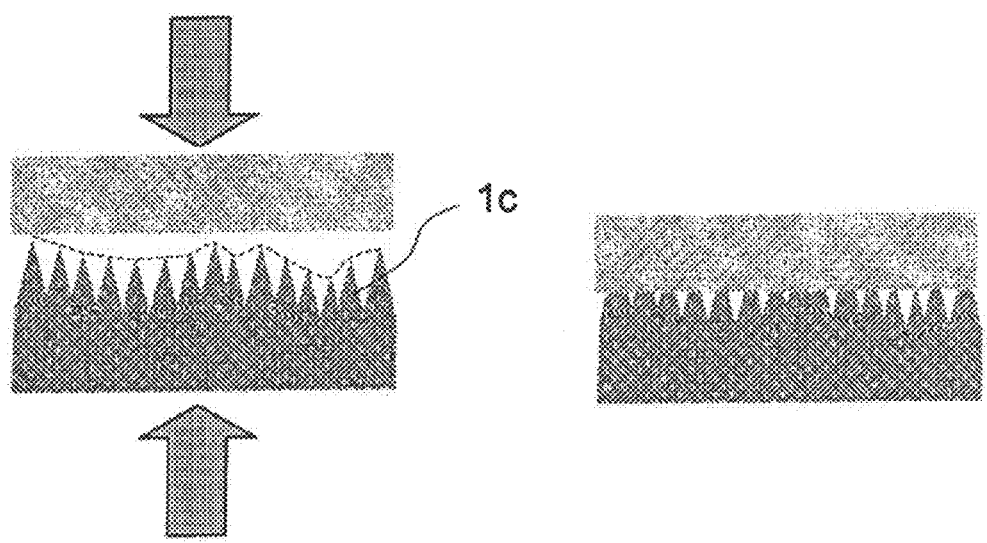

It is desirable that the height of protrusions that form the uneven structure of the stress concentrating means 1c is not less than the range of the height variation (difference in vertical position of the crests) of all protrusion crests on the joining faces. As illustrated in FIG. 4a (without the stress concentrating means) and FIG. 4b (with the stress concentrating means), this structure can increase the total contact area of the joining faces by deformation of the uneven structure.

In the stress concentrating means 1c, since the stress is concentrated to each protrusion of the texture, resulting local but large plastic deformation increases the contact area of the joining faces. To cope with this, the uneven structure may be composed of several types of protrusions with different shapes as illustrated in FIG. 2(c). This allows for adjustment or optimization of the balance between the stress concentration effect and the substantial contact area increasing effect.

The above-described stress concentrating means 1c may be formed by cutting, grinding, plastic forming (roller machining), laser machining, electric discharge machining, etching, lithography, or the like, and the forming method is not particularly limited. However, plastic forming allows for very low cost manufacture.

While the above-described embodiment uses the zinc foil insert to join aluminum-based metal materials, application of the joining method of the present invention is not limited to this combination.

That is, the insert for joining the aluminum-based metal materials may be made of any metal material that reacts with Al to cause eutectic reaction. Besides the zinc foil, materials that can be used include magnesium (Mg) foil, tin (Sn) foil, Zn, Mg, Sn and alloys containing any of these metals as the major component, and alloys of Al with any of these metals as well. As used herein, the term "major component" means the content of the above-described metal is 80% or more. Specifically, such materials are metals (pure metals and alloys) that contains 80% or more of any of Zn, Mg, Sn, Zn+Mg, Zn+Sn, Mg+Sn, Zn+Mg+Sn, Zn+Al, Mg+Al, Sn+Al, Zn+Mg+Al, Zn+Sn+Al, Mg+Sn+Al and Zn+Mg+Sn+Al.

Cu (copper) is also a metal that reacts with Al to cause eutectic reaction, and can also be used. However, since the melting point of Cu is higher than Al, Cu as the insert is required to be used in the form of a Cu—Al alloy in which Cu is alloyed with Al in an adjusted proportion in advance so that the melting point decreases to a value lower than that of the aluminum-based alloy base material.

Meanwhile, the members to be joined are not limited to aluminum-based metal materials. For example, the method is applicable for joining copper, copper alloys, magnesium, magnesium alloys, nickel, nickel-based alloys and iron-based materials.

Further, the method is applicable for joining dissimilar materials unless both of the members to be joined are made of material with a firm oxide film such as aluminum-based metal materials and magnesium-based metal materials.

The insert for joining copper and copper alloys may be made of, for example, Al, Ag (silver), Sn or an alloy thereof in the above-described manner.

Besides the above materials, Ti (titanium) is also a metal that reacts with Cu to cause eutectic reaction. However, since the melting point of Ti is higher than Cu, Ti as the insert is required to be used in the form of an alloy as described above in which Ti is alloyed with Al in advance so that the melting point decreases to a value lower than that of Cu.

Further, the insert for joining magnesium and magnesium alloys may be made of, for example, Al, Zn or an alloy thereof in the above-described manner.

Si (silicon) is also an element that reacts with Mg to cause eutectic reaction. However, since the melting point of Si is higher than Mg, Si as the insert is required to be used in the form of an alloy as described above in which Si is alloyed with Mg in advance so that the melting point decreases to a value lower than that of Mg. Also, it is desirable that Al is also used in the form of an alloy as the insert, since the melting point of Al is close to that of Mg.

Further, the insert for joining nickel and nickel-based alloys may be made of, for example, Cu or an alloy thereof in the above-described manner.

Besides Cu, Ti, Nb (niobium) and Cr (chromium) are also metals that react with Ni to cause eutectic reaction. However, since the melting points of them are higher than Ni, when any of them are used as the insert, it is required to be used in the form of an alloy as described above in which it is alloyed with Ni in advance so that the melting point decreases to a value lower than that of Ni.

For joining iron-based materials, the insert may be made of an alloy of Fe with C, N or Cr having a decreased melting point lower than the base material.

Regarding the shape of the insert and the method of intervening the insert between the members to be joined, it is desirable that a foil insert is inserted between the members for the sake of high flexibility in composition and shape (thickness).

Alternatively, either or both of the joining faces of the members may be coated with the insert in advance by plating or powder deposition. In this case, the coating can also prevent formation of the oxide film, which is particularly effective is joining dissimilar materials.

The joining method of the present invention may be carried out in an inert gas atmosphere, or even in the air without any difficulty.

Needless to say, the method may also be carried out in vacuum. However, in this case, not only vacuum equipment is required, but also a melted insert may cause damage to a vacuum gauge or a gate valve. Accordingly, operation in the air is advantageous also in terms of cost.

In the joining method of the present invention, a means for heating and maintaining the joining portion in the above-described temperature range is not particularly limited. For example, resistance heating, high-frequency heating, infrared heating or a combination thereof may be employed.

Regarding the joining temperature, excessively high temperature results in an excessive amount of the liquid phase due to the melted base material. Such an excessive liquid phase tends to be left at the joining interface to cause insufficient strength. Specifically, the temperature is preferably in the range from the eutectic point to less than the eutectic point +100° C.

Regarding the heating rate to the above-described joining temperature, a faster rate is preferred, because too slow rate may cause oxidation of the interface to disrupt discharge of the melt, which results in decreased strength. This is particularly likely to occur in a joining process in the air. Specifically, the rate is 3° C./sec or more, more desirably 10° C./s or more, yet more desirably 25° C./s or more.

Regarding the applied pressure during the joining step of the joining method of the present invention, the joining method can be operated under an applied pressure as low as 30 MPa or less. This makes it possible to reduce the applying load so as to prevent damage of the members to be joined as well as to simplify the pressing system, which allows for reduction of the energy consumption and the resulting cost.

The joined structure produced by the joining method of the present invention includes direct joined portions between the joined members and indirect joined portions mediated by a mixture containing the oxide film of the joined members and the eutectic reaction product, both of which are randomly aligned on the joining interface of the joined members. Accordingly, the joined structure has high joining strength, sealing property and low distortion.

Regarding the structure of the joined component produced by the joining method of the present invention, the mixture of the eutectic melt, the oxide film and the like are discharged from the joining interface so that the members to be joined are directly joined. Depending on the joining conditions, the mixture may not be completely discharged. In this case, mixture intervening portions might be dispersed among the directly joined portions.

Further, diffusion of an insert-derived component (Zn in the above-described embodiment) is observed in the vicinity of the joining plane of the joined member (aluminum alloy in the above-described embodiment), which further improves the joining strength.

Figure 5:
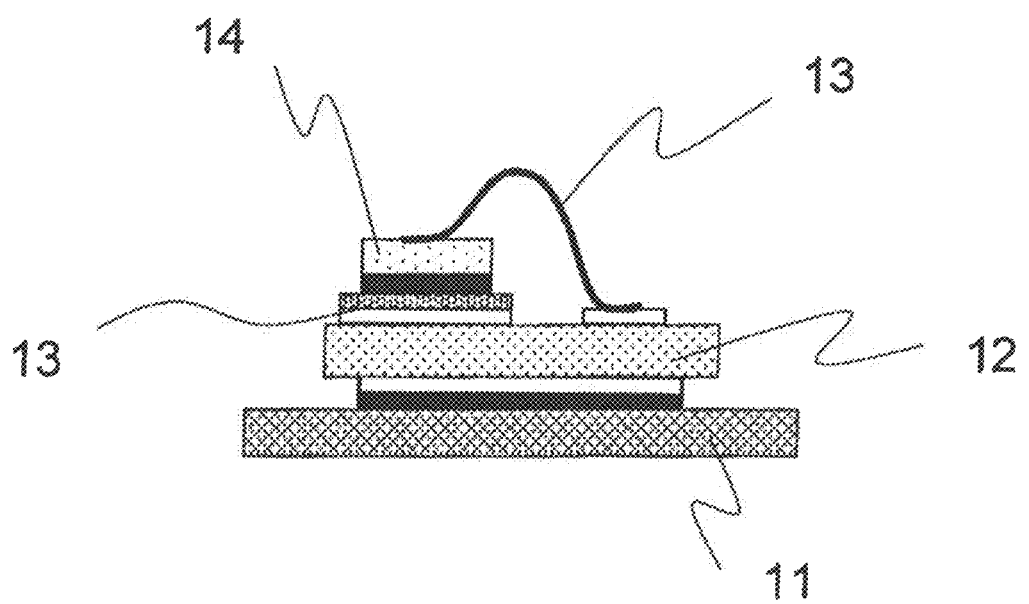
FIG. 5 is a schematic view illustrating the mount structure of a semiconductor chip, which is an example of the joined component produced by the joining method of the present invention.

FIG. 5 is a schematic cross sectional view illustrating the structure of a semiconductor component produced by joining a semiconductor chip by the above-described joining method, which is an embodiment of the present invention.

The semiconductor component illustrated in the figure includes an insulated base board 12 fixed on a heat sink 11, and a silicon chip 14 is joined to a lead metal 13 placed on the surface of the base board 12.

The lead metal 13 is an aluminum alloy, and the joining face of the silicon chip 14 is coated with aluminum in advance. That is, these aluminum-based metals are joined to each other by the method of the present invention.

Before joining the lead metal 13 to the silicon chip 14, an uneven structure is formed on the joining face of the aluminum alloy lead metal 13 as the stress concentrating means by plastic forming or grinding. Then, a 25 µm thick Al—Sn—Zn alloy quenched foil is placed between the lead metal 13 and the silicon chip 14 as the insert, and is fixed by a jig so that a pressure of 15 MPa or less is constantly applied Then, the assembly is directly placed in, for example, a welding furnace, and the temperature is maintained at 400° C. for 1 min to join the lead metal 13 to the silicon chip 14.

Since the joining process is carried out at a low temperature within a short period, this method can minimize a thermal influence on the semiconductor chip, and thus can prevent distortion of the component and degradation of its performance. Further, a plurality of chips can be joined at once. Besides the above-described silicone chip, semiconductor chips that can be used include various types of chips such as SiC and GaN.

Figure 6:
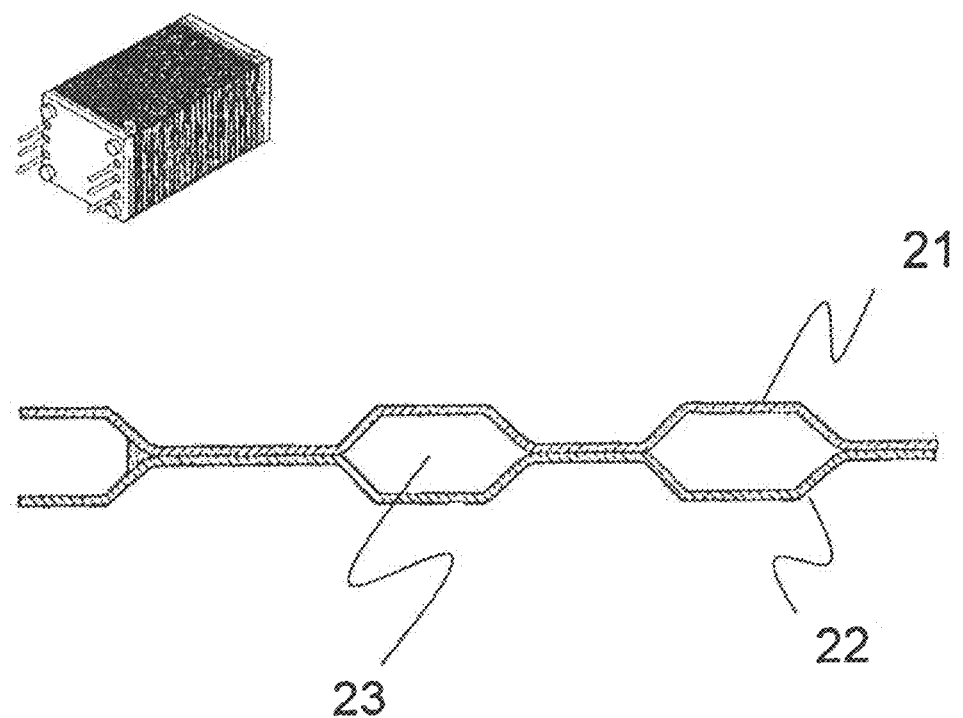
FIG. 6 is a schematic view illustrating the structure of a fuel cell separator, which is another example of the joined component produced by the joining method of the present invention.

FIG. 6 is a cross sectional view illustrating an aluminum alloy separator for fuel cells joined by the above-described joining method, which is another embodiment of the present invention.

In the figure, the separator for fuel cells includes two corrugated plates 21, 22 made from aluminum alloy plates (e.g. 5000 series and 6000 series) by press molding, which are mated as illustrated in the figure and joined to each other at the mated portions so that they form a channel 23 for fuel gas or oxidizing gas. An uneven structure is similarly formed on the joining faces of the corrugated plate 22 as the stress concentrating means.

In the joining step, the corrugated plates 21, 22 are mated with intervening a 100 µm thick zinc foil tape insert at the joining portions. They are fixed and pressed by a jig, and are placed in a high-frequency induction heating furnace.

Then, the temperature is raised and maintained at, for example, 450° C. so as to allow the plates 21, 22 to join to each other. The aluminum alloy separator for fuel cells is thus produced.

With the separator manufactured as described above, it becomes possible to obtain high-precision fuel cell stacks having good sealing properties and low distortion as with the above embodiment and no risk of gas leak.

Further, in this method, a number of separators may be placed in a large furnace so that many joining portions can be joined at once, which allows for efficient manufacture compared to manufacture by TIG welding or laser welding.

Figure 7:
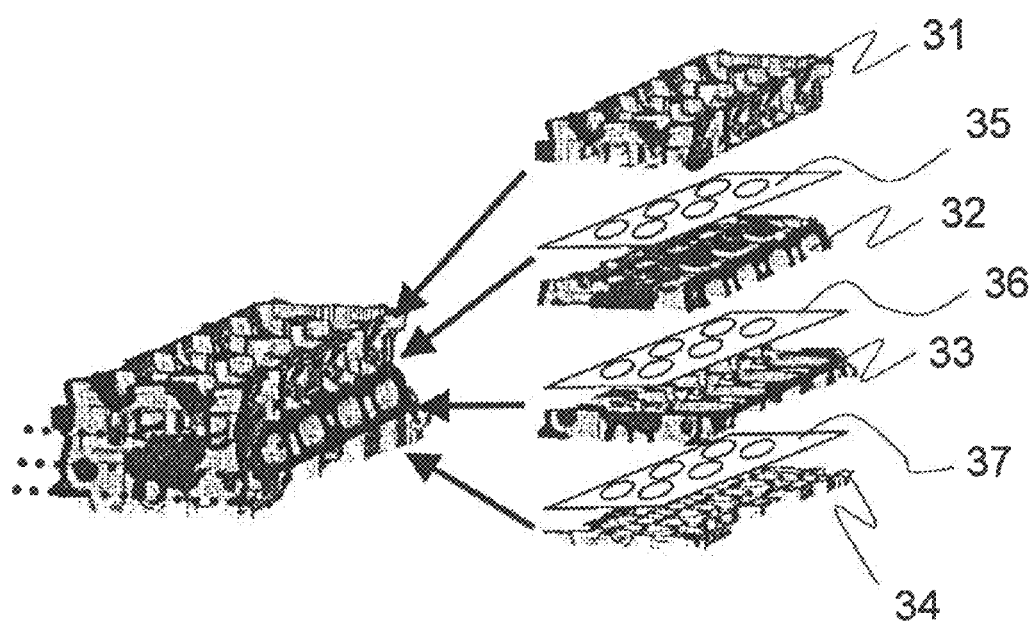
FIG. 7 is a schematic view illustrating the structure of a separate cast engine head block, which is another example of the joined component produced by the joining method of the present invention.

FIG. 7 is a schematic view illustrating the structure of a separate casted engine head block joined by the above-described joining method, which is an embodiment of the present invention.

The engine head block illustrated in the figure is composed of four separate casted pieces 31, 32, 33 and 34 of aluminum alloy for die cast, e.g. Al—Si—Cu—Mg alloy (AC4D).

After an uneven structure is formed on each joining faces as the stress concentrating means in advance, those four separate pieces 31, 32, 33 and 34 are stacked as illustrated in the figure, with sandwiching 300 μm thick pure zinc foil inserts 35, 36 and 37 each of which has round holes at the position corresponding to cylinder bores.

After they are fixed and pressed with each other by a predetermined jig, the temperature is raised and maintained in a high-frequency induction heating furnace in the range of approximately from 382° C. to 482° C. where the eutectic reaction of Al and Zn occurs, e.g. at 450° C., so as to allow the separated pieces to be joined to each other. The engine head block is thus produced.

The engine head block manufactured as described above has good sealing property and low distortion. Further, its casting process does not require cores for forming the bores, which results in improved design flexibility.

EXAMPLES

Hereinafter, the present invention will be specifically described with reference to examples.

(1-1) Samples

Figure 8:
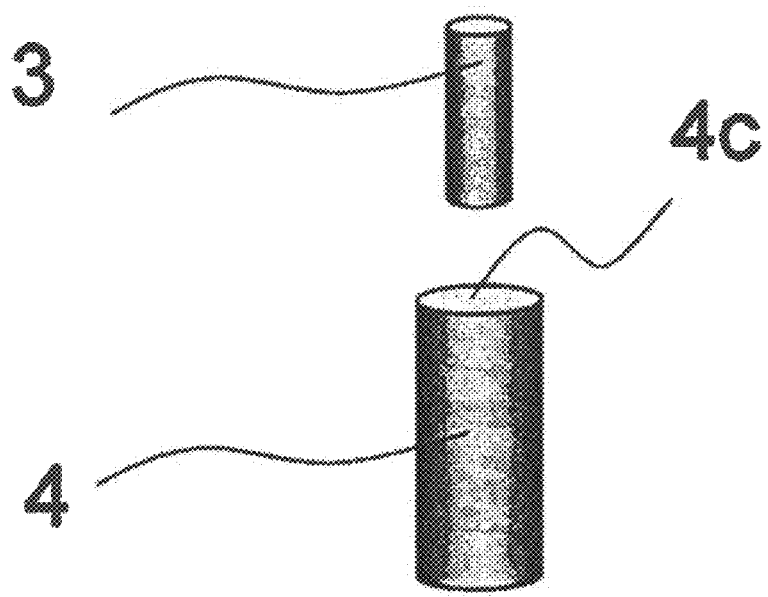
FIG. 8 is a perspective view illustrating the outer shape of round rods used for the examples of the present invention.

As illustrated in FIG. 8, a round rod 3 having a size of 15 mm in length and 5 mm in diameter and a round rod 4 having a size of 25 mm in length and 10 mm in diameter, both of which are made of aluminum alloy A6061 (Al—Mg—Si type), were prepared.

In each example of the present invention, a stress concentrating means 4c having an uneven structure as illustrated in FIGS. 9(a) to 9(c) was formed on either or both of the joining end faces by precision cutting. The other joining face with no stress concentrating means was mirror finished.

For comparison, other samples were prepared in which both joining faces were mirror finished by lapping. These samples were subjected to the following joining test.

As an insert, a 100 μm thick quenched foil tape made of Zn—Al—Sn alloy having a diameter of 8 mm was prepared.

(1-2) Joining Process

Figure 10:
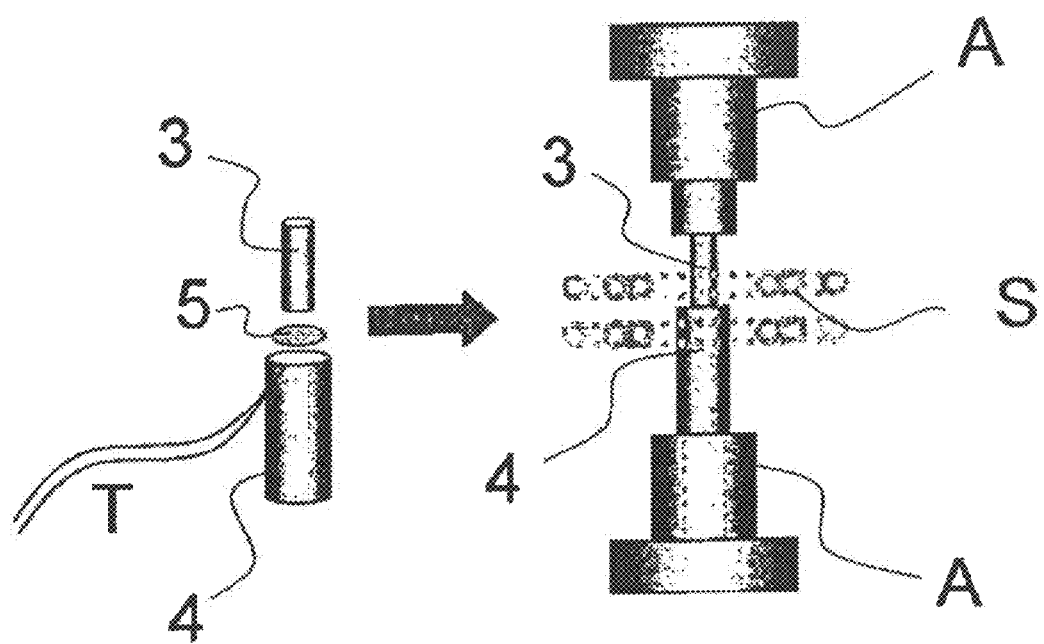
FIG. 10 is a schematic view illustrating a butt joining process of the round rods in the examples of the present invention.

As illustrated in FIG. 10, the insert 5 having the above-described composition and size was placed between the joining end faces of the round rods 3 and 4. While being pressed by anvils A, A in the air, the sample was heated up to a temperature in the range from 400° C. to 500° C. by a high-frequency heating coil S installed around the joining portion. After reaching a desired joining temperature, the temperature was maintained for 1 min to allow the sample to be joined. The rate of temperature increase was set to 10° C./sec. The joining temperature was measured by a type R thermocouple that was welded on the side face of the round rod 4 near the joining end face. The pressurization by the anvils A, A was started from an ambient temperature condition, and was ended after joining.

As the comparative examples, the round rods with no stress concentrating means prepared as described above were also joined to each other in the same manner.

(1-3) Evaluation Method

The joining strength of each obtained test piece was evaluated by a tensile test using a universal tester. The test rate was set to 1 mm/min. The results are shown in table 1 along with the shapes of the stress concentrating means and the joining conditions.

TABLE I

|  | Stress Concentrating Means | | | | Results of Joining | | |
| --- | --- | --- | --- | --- | --- | --- | --- |
| Type | Pattern | Pitch (μm) | Aspect Ratio | Position | Applied Pressure (MPa) | Joining Strength (MPa) | Evaluation* |
| Comparative Example 1 | NA | — | — | Both mirror finished | 35 | 10 | D |
| Comparative Example 2 | NA | — | — | Both mirror finished | 50 | 53 | A |
| Inventive Example 1 | Unidirectional: FIG. 9(a) | 100 | 0.001 | Both crossing position | 30 | 90 | A |
| Inventive Example 2 | Unidirectional: FIG. 9(a) | 100 | 0.001 | Both crossing position | 10 | 39 | C |
| Inventive Example 3 | Unidirectional: FIG. 9(a) | 100 | 0.01 | Both crossing position | 10 | 42 | B |
| Inventive Example 4 | Unidirectional: FIG. 9(a) | 100 | 0.1 | Both crossing position | 10 | 48 | B |
| Inventive Example 5 | Unidirectional: FIG. 9(a) | 100 | 1 | Both crossing position | 10 | 101 | A |
| Inventive Example 6 | Unidirectional: FIG. 9(a) | 10 | 1 | Both crossing position | 10 | 76 | A |
| Inventive Example 7 | Unidirectional: FIG. 9(a) | 10 | 0.1 | Both crossing position | 10 | 48 | B |
| Inventive Example 8 | Unidirectional: FIG. 9(a) | 10 | 0.001 | Both crossing position | 10 | 36 | C |
| Inventive Example 9 | Unidirectional: FIG. 9(a) | 1 | 1 | Both crossing position | 10 | 42 | B |
| Inventive Example 10 | Unidirectional: FIG. 9(a) | 1 | 0.01 | Both crossing position | 10 | 39 | C |
| Inventive Example 11 | Unidirectional: FIG. 9(a) | 100 | 1 | Both crossing position | 5 | 86 | A |
| Inventive Example 12 | Unidirectional: FIG. 9(a) | 100 | 1 | Both crossing position | 3 | 38 | C |
| Inventive Example 13 | Unidirectional: FIG. 9(a) | 10 | 0.1 | The other is mirror finished | 10 | 48 | B |
| Inventive Example 14 | Independent: FIG. 9(b) | 10 | 0.1 | The other is mirror finished | 10 | 54 | A |
| Inventive Example 15 | Coil: FIG. 9(c) | 10 | 0.1 | The other is mirror finished | 10 | 42 | B |

*Evaluation criteria A: strength of over 50 MPa, B: strength of over 40 MPa, C: strength of 30 MPa, D: strength of 30 MPa or less In the above-described, inventive examples, the uneven structure as the stress concentrating means was defined by its pitch and aspect ratio, where the pitch is referred to the pitch of protrusions of an uneven structure, and the aspect ratio is referred to a value of the height of the protrusions divided by the pitch of the protrusions. With a variety of different pitches and aspect ratios, the experimental results show the influence of the pitch and aspect ratio on the joining strength.

As can be clearly seen in table 1, the comparative examples with no uneven structure as the stress concentrating means did not exhibit sufficient joining strength, unless the applied joining pressure was as high as approximately 50 MPa as in comparative example 2.

In contrast, by providing the stress concentrating means, inventive examples 1 to 15 exhibited sufficient joining strength although they were joined under a very low applied pressure of 30 MPa or less, which allows for simplifying the pressing system, reducing the energy cost and reducing damage to the members to be joined.

Regarding the position of the stress concentrating means, it was observed that the resulting joining strength was high even under a lower pressure when the stress concentrating means was formed on both joining faces of a pair of members to be joined and when they are arranged in an approximately perpendicular (crossing) position.

Further, regarding the shape of the stress concentrating means, it was observed that its effects were remarkable when the pitch was 1 μm or more and the aspect ratio was 0.001 or more, compared to the comparative examples having mirror finished joining faces with no stress concentrating means.

Figure 11:
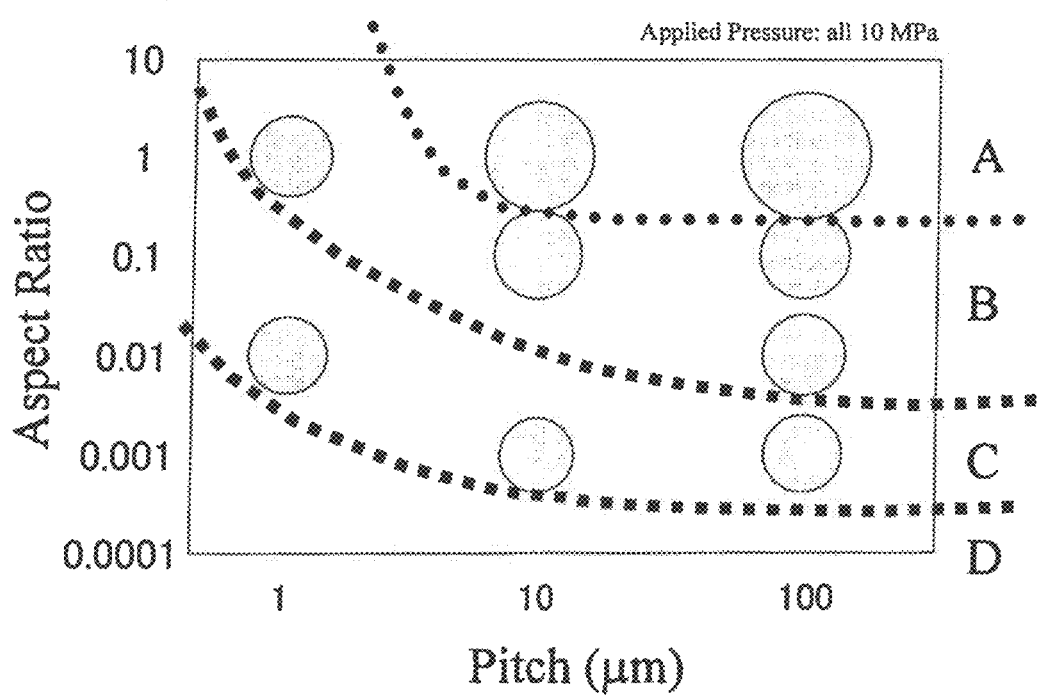
FIG. 11 is a graph showing an influence of the pitch and the aspect ratio on the joining strength according to the joining method of the present invention.

FIG. 11 shows the experimental results of inventive examples 2 through 10 in the condition under an applied pressure of 10 MPa, where the horizontal axis is pitch, the vertical axis is aspect ratio, the size of circles represents joining strength. Further, the graph was sectioned into four areas according to the level of the joining strengths (where A: the joining strength is over 50 MPa, B: the joining strength is over 40 MPa and 50 MPa or less, C: the joining strength is over 30 MPa and 40 MPa or less, and D: the joining strength is 30 MPa or less).

As shown in the figure, the effect of enhancing the joining strength is prominent particularly when the pitch is 10 μm or more and the aspect ratio is 0.1 or more.

Figure 9:
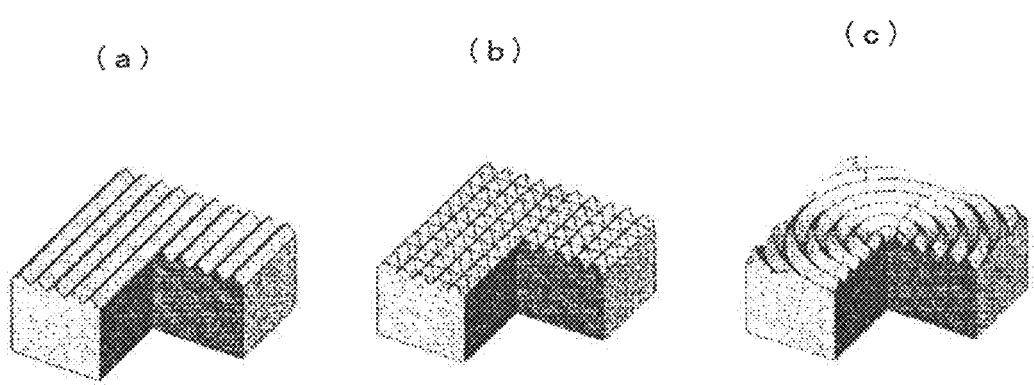
FIGS. 9(a) to 9(c) are perspective views illustrating the shapes of the stress concentrating means formed on joining faces in the examples of the present invention.

Inventive examples 13 to 15 are examples in which the stress concentrating means was formed only one of the joining faces of the members to be joined, and the other face was mirror finished as in the comparative examples. They respectively have the following three patterns of the stress concentrating means as illustrated in FIG. 9: (a) unidirectional, (b) independent and (c) coil, and the resulting joining strengths were compared.

As a result, the strength was the highest when the textured pattern of the stress concentrating means had the independent shape as illustrated in FIG. 9(b).

Figure 12:
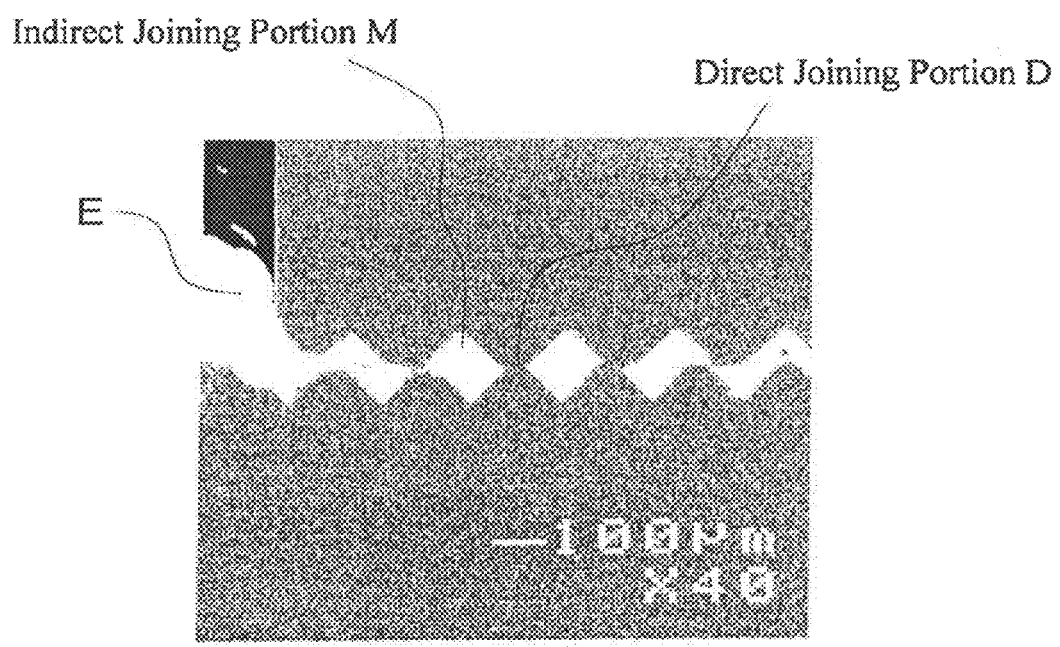
FIG. 12 is an electron micrograph of a joined portion of inventive example 5, which is an exemplary cross sectional view of a joined portion produced by the joining method of the present invention.

FIG. 12 is an electron micrograph of the joining portion of inventive example 5, which is a cross sectional view of an exemplary joining portion obtained by the present invention.

As illustrated in FIG. 11, the joining interface has a unique interface structure where there are a plurality of direct joining portions D between the members to be joined, i.e. the aluminum alloys in this example and a plurality of indirect joining portions M mediated by at least the Zn—Al—Sn alloy of the insert or the eutectic reaction product of the alloy with the members to be joined, which are aligned on the interface. The excess eutectic reaction product is discharged as a discharge E out of the joining interface along with the broken oxide film flakes.

The direct joining portions D have features of high joining strength and low electric resistance and low heat resistance at the joining interface, and are suitable for joining semiconductor chips as illustrated in FIG. 5.

Meanwhile, the indirect joining portions M have a sufficient joining strength because the stress concentrating means contributes to increasing the apparent length of the joining line, and can form a joining interface structure with high sealing property and high water-tightness. This joining interface structure is suitable for joining separate casted engine head blocks as illustrated in FIG. 7.

While the present invention is described with reference to the inventive examples, the present invention is not intended to be limited to those inventive examples, and it is understood that any modification may be made in the material of the members to be joined, the material of the insert, the shape and dimension of the stress concentrating means without departing from the gist of the present invention.

REFERENCE SIGNS LIST 1, 3, 4 member to be joined
1a oxide film
1c, 4c stress concentrating means
2, 5, 35, 36, 37 insert
D direct joining portion
M indirect joining portion

The invention claimed is:
1. A joining method comprising:
preparing two members to be joined, each of the two members to be joined having an oxide film disposed over a surface thereof,
preparing an insert including an uneven structure for breaking an oxide film, the uneven structure including at least one protrusion having an aspect ratio of greater than or equal to 0.001,
disposing the insert between the two members to be joined,
applying pressure to the two members to be joined to break the oxide film of the two members to be joined with the uneven structure of the insert, and
heating the two members to be joined to initiate a eutectic reaction between the two members to be joined and the insert, such that a eutectic melt produced by the eutectic reaction and the broken oxide film are discharged from between the two members to be joined.

2. The joining method according to claim 1, wherein the protrusion comprises an approximately flat face.

3. The joining method according to claim 1, wherein the protrusion comprises a linear shape.

4. The joining method according to claim 1, wherein the protrusion comprises an approximately pointed shape.

5. The joining method according to claim 1, wherein the protrusion comprises an approximately spherical shape.

6. The joining method according to claim 1, wherein the uneven structure comprises a plurality of protrusions, and a height of the protrusions of the uneven structure is not less than a difference in vertical position of crests of all of the protrusions.

7. The joining method according to claim 1, wherein the uneven structure has a pitch of 1 μm or more.

8. The joining method according to claim 7, wherein the uneven structure has an aspect ratio of 0.1 or more and a pitch of 10 μm or more.

9. The joining method according to claim 1, wherein the uneven structure comprises a plurality of protrusions with different shapes.

10. The joining method according to claim 1, wherein preparing the insert comprises forming the uneven structure by plastic forming.

11. The joining method according to claim 1, wherein the applied pressure is 30 MPa or less.

12. The joining method according to claim 1, wherein the insert is made of foil material.

13. A component produced by the joining method according to claim 1, wherein the two members to be joined are directly joined without an oxide film disposed between joined portions of the two members to be joined.

14. The component according to claim 13, wherein a component derived from the insert is diffused in a vicinity of joining faces of the two members to be joined.

15. A joining structure produced by the joining method according to claim 1, comprising:
- a direct joining portion disposed between the two members to be joined, and
- an indirect joining portion comprising a mixture of the oxide film of the two members to be joined and a product of the eutectic reaction,
- wherein the direct joining portion and the indirect joining portion are randomly located on a joining interface.

\* \* \* \* \*